United States Patent [19]

Rogers et al.

[11] Patent Number: 4,713,720

[45] Date of Patent: Dec. 15, 1987

[54] FAST ACTING SOLID STATE AC CIRCUIT BREAKER

[75] Inventors: Robert T. Rogers, Blacksburg, Va.; James C. Siewert, Mobile, Ala.

[73] Assignee: Litton Systems, Inc., Blacksburg, Va.

[21] Appl. No.: 862,958

[22] Filed: May 14, 1986

[51] Int. Cl.$^4$ ............................................. H02H 7/20
[52] U.S. Cl. ..................................... 361/97; 307/361; 361/93
[58] Field of Search .................... 361/93, 94, 95, 96, 361/97, 98; 324/51, 52; 302/361

[56] References Cited

U.S. PATENT DOCUMENTS

| | | | |
|---|---|---|---|
| 3,602,783 | 8/1971 | Engle et al. | 361/96 |
| 3,996,499 | 12/1976 | Gary et al. | 361/95 |
| 4,060,844 | 11/1977 | Davis et al. | 361/96 |
| 4,277,811 | 7/1981 | Sato | 361/98 X |
| 4,414,601 | 11/1983 | Conroy, Jr. et al. | 361/94 X |
| 4,562,506 | 12/1985 | Moran | 361/94 X |

Primary Examiner—A. D. Pellinen
Assistant Examiner—Jeffrey A. Gaffin
Attorney, Agent, or Firm—Brian L. Ribando

[57] ABSTRACT

A fast acting solid state AC circuit breaker includes a power transistor module in series with a load. Load current is continuously monitored and compared with threshold current values which define maximum current for equipment turn-on and steady state conditions. The steady state conditions may be briefly exceeded to allow normal transient overloads to exist on the line for periods up to 25 milliseconds. A maximum current level greater than the normal transient overload can exist on the line for 10 milliseconds after the circuit breaker turns on. The circuit breaker can be turned off in less than 10 microseconds.

15 Claims, 5 Drawing Figures

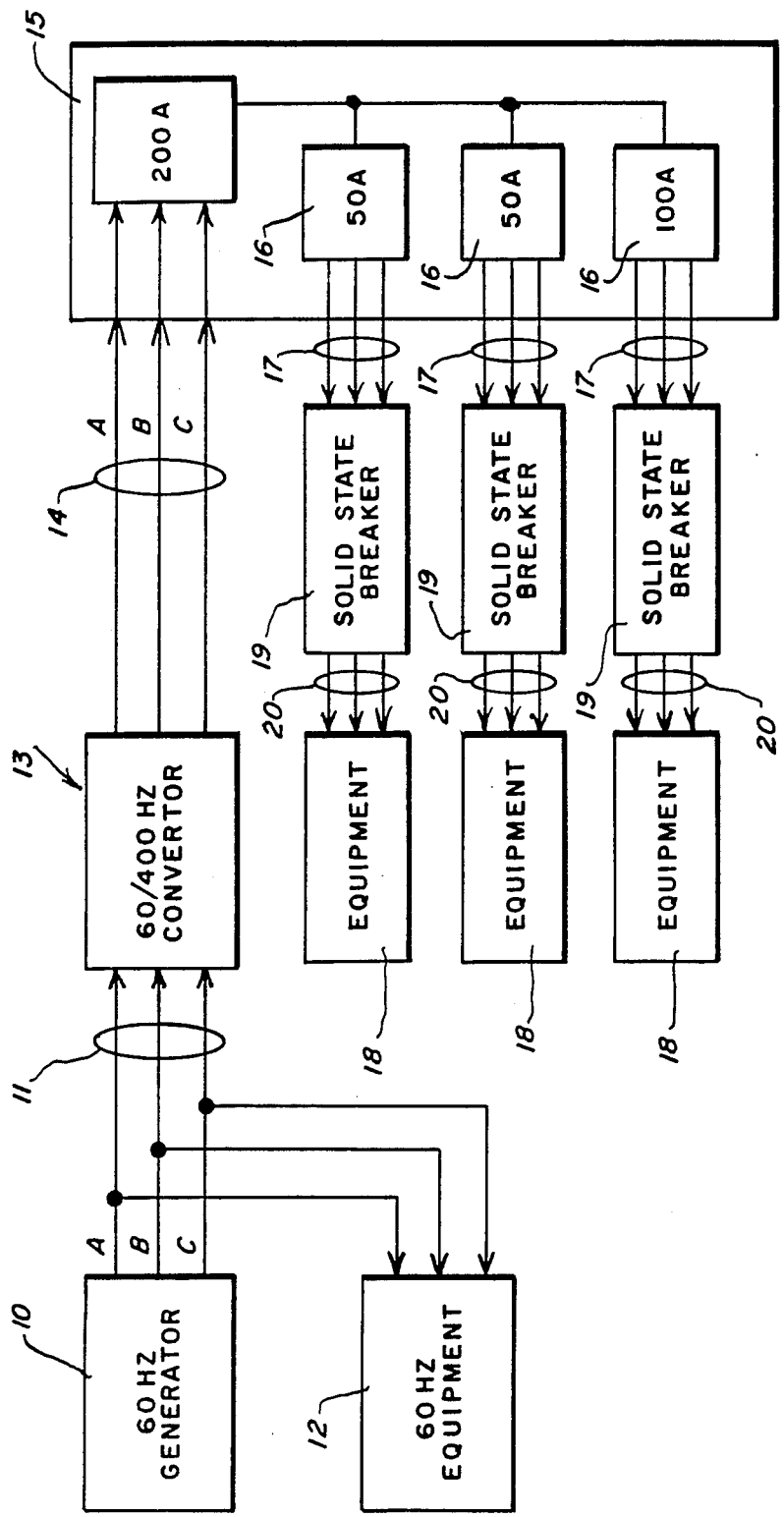
Fig_1

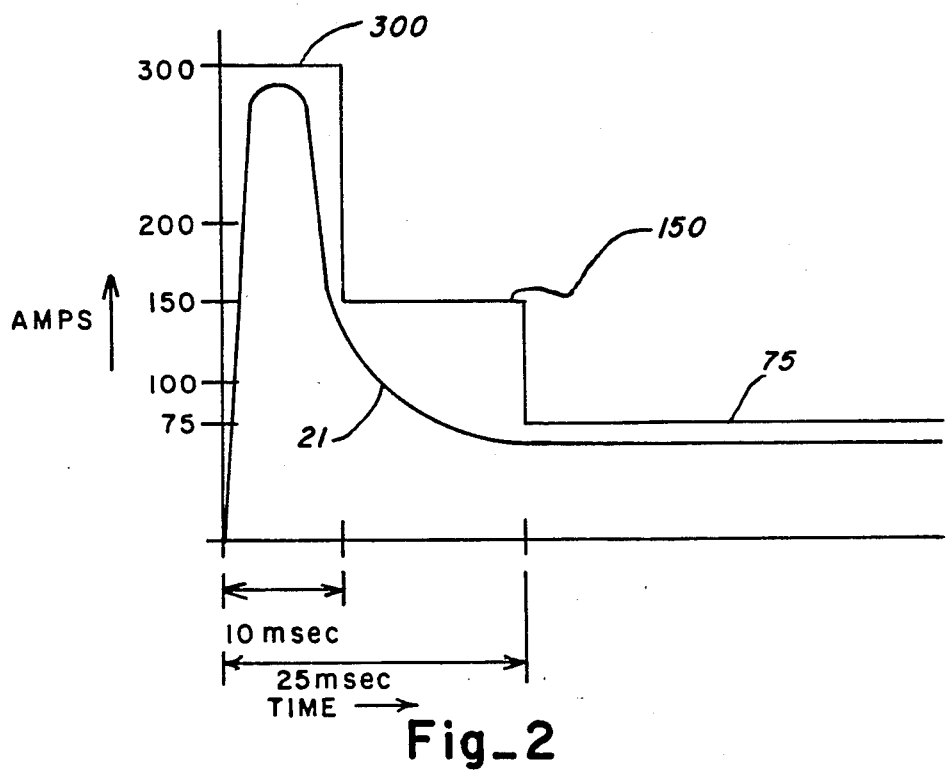
Fig_2
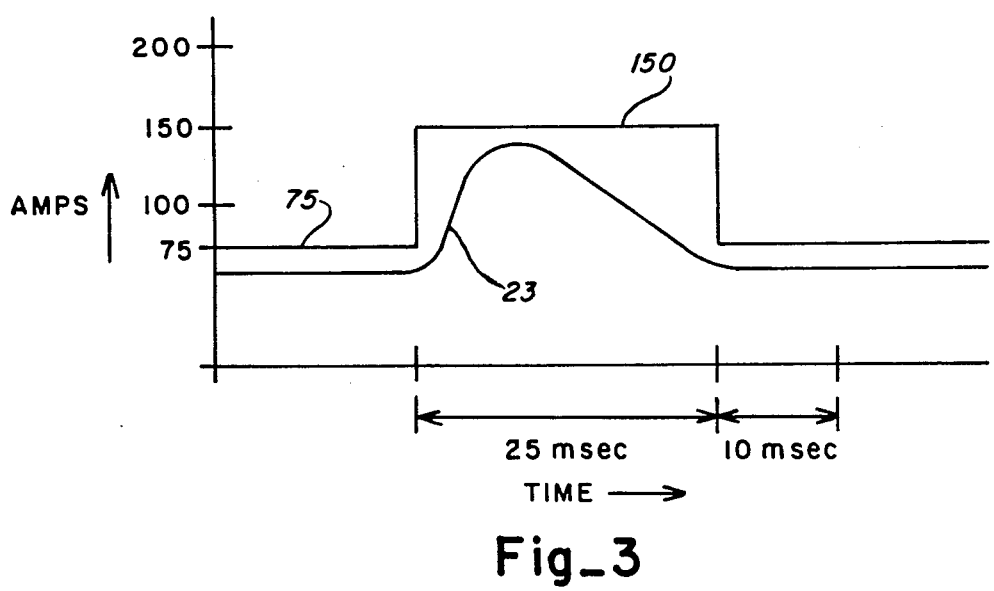
Fig_3

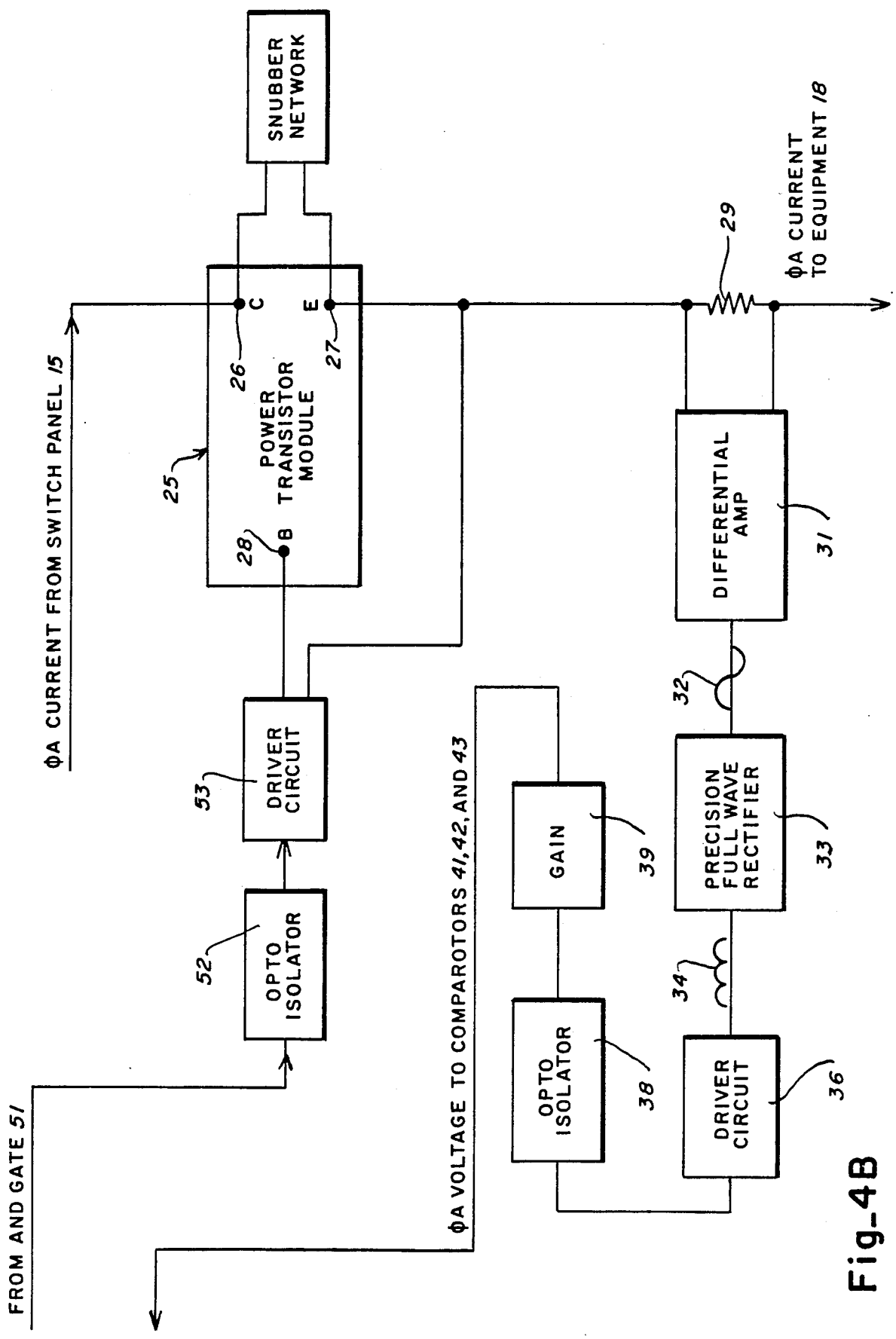
Fig_4B

FAST ACTING SOLID STATE AC CIRCUIT BREAKER

BACKGROUND OF THE INVENTION

This invention relates to a fast acting solid state AC circuit breaker.

Circuit breakers are normally used to protect power distribution systems by monitoring the current to a load. When the current reaches an excessive level which could cause damage to the line, the breaker opens to prevent the flow of the current to thereby protect both the line and the load. Prior art circuit breakers may comprise a fuse link which overheats as a result of excessive current and melts thus opening, or may take the form of a mechanical device which when set provides a current path, wherein the path is mechanically opened by a reaction of the breaker to a fault. Fuse link or mechanical circuit breakers, because of their inherent lag in responding to line faults, do not immediately open a circuit in response to a fault. This is acceptable, however, since the line itself can safely handle a fault for a brief period of time.

A problem exists, however, in the case of power distribution systems which are supplied by solid state frequency converters. Such converters are designed to go into a self-protecting current limiting mode if a fault of a sufficient magnitude occurs. Because of the slow reaction time of mechanical circuit breakers, such breakers do not have a chance to open before the frequency converters enter the self-protecting current limiting mode. Once this has occurred, the entire system is without power, and it is impossible to tell where the fault is since no circuit breaker has tripped to indicate the location of the fault. In such situations, the fault may be found by opening the circuit breakers one at a time beginning with those breakers which are nearest to the frequency converter until the fault is isolated. This process is very time consuming and is unacceptable in certain situations.

It would therefore be desirable to provide a fast acting circuit breaker which would open before a solid state frequency converter could switch into its current limiting mode so that a load fault would not result in loss of power to the entire system.

SUMMARY AND OBJECTS OF THE INVENTION

A fast acting solid state AC circuit breaker comprises a solid state power transistor module (PTM) of the Darlington type with a damper diode in series with a load circuit. The load current is sensed in a resistor, and the load current is compared with preselected threshold current values for equipment turn-on, load start-up, and steady state conditions. Control circuitry monitors the comparison to control a driver circuit which turns the PTM off.

The PTM with suitable driver circuitry is able to be turned off in less than 10 microseconds. This is sufficiently fast to prevent a solid state frequency converter which is supplying power to the load from switching into a self-protection current limiting mode in response to a fault, thus removing the power from the entire line.

In order to allow transients which exceed the normal steady state current limit to exist on the line without tripping the circuit breaker, a three level current threshold is utilized during initial turn-on. Brief current surges are also tolerated after turn-on to allow additional loads to be added to the line.

It is therefore an object of the invention to provide a fast acting solid state AC circuit breaker.

It is another object of the invention to utilize a power transistor module of the Darlington type with a damper diode in a unique manner to provide a fast acting AC circuit breaker.

It is another object of the invention to provide a fast acting solid state circuit breaker in which the current waveform to a load is compared to preselected threshold current values in order to determine if excessive current is being drawn.

It is another object of the invention to provide a fast acting solid state circuit breaker in which a logic network opens the breaker to interrupt current to a load if the monitored current exceeds preselected threshold current levels.

It is still another object of the invention to provide a logic network for a circuit breaker which allows steady state current levels to be exceeded during equipment turn-on and load start-up.

It is another object of the invention to provide a circuit breaker useful in power distribution systems which is sufficiently fast acting to prevent a solid state frequency converter from entering a self-protection current limiting mode in response to a fault in the system.

These and other objects of the invention will become apparent from the following detailed description taken in conjunction with the accompanying drawing figures in which reference numerals used throughout the description designate like or corresponding parts on the figures.

BRIEF DESCRIPTION OF THE DRAWINGS

FIG. 1 is a schematic drawing of a power generating and distribution system.

FIG. 2 is a graph showing maximum permissable inrush current during system turn-on.

FIG. 3 is a graph showing maximum permissable inrush current during load start-up.

FIGS. 4A and 4B are schematic drawings of the fast acting solid state breaker of the invention.

Turning now to FIG. 1, there is shown a basic electrical power generation system comprising a 60 hertz generator 10 which supplies three-phase power on lines 11 to general purpose devices 12 such as lights, motors, and 60 hertz user equipment. The lines 11 are also coupled to a solid state frequency converter 13 which converts the 60 hertz power from the generator 10 to DC and then chops the DC power into 400 hertz three-phase AC power. The three-phase output lines 14 from the frequency converter 13 are coupled to a switch board 15 comprising a number of mechanical circuit breakers 16 having selected amperage values. Each mechanical circuit breaker 16 is coupled to three-phase distribution lines 17 which supply power to the equipment 18. According to the invention, each three-phase power distribution line 17 includes a solid state AC circuit breaker 19 between the mechanical breaker 16 and the equipment 18.

Figure 4A:
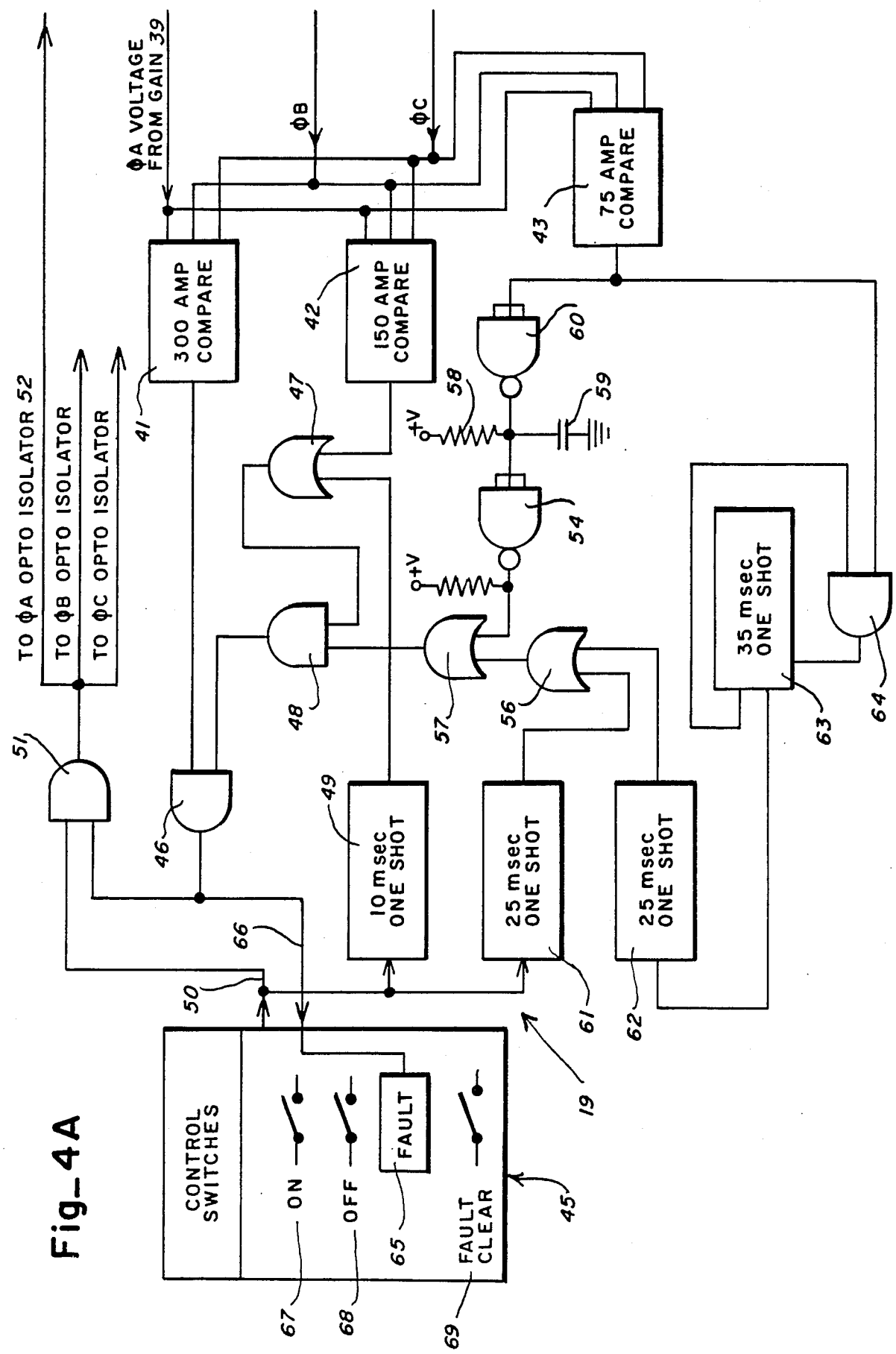

The frequency converter 13 is a solid state device which has a self-protect current limiting mode. In order for a circuit breaker 19 downstream of the frequency converters 13 to be effective, the circuit breaker 19 must open before self-protect current limiting is reached. The main purpose of the circuit breaker 19 is to respond to any fault downstream of the breaker and to open the power line 20 between the circuit breaker 19 and the failure point faster than the frequency converter 13 can react. This prevents the frequency converter 13 from totally shutting down as a result of a fault.

The solid state circuit breaker 19 comprises a circuit which includes a power transistor module (PTM). When the PTM is on, current will pass to the equipment 18. When the PTM is off, the PTM breaks the current path between the equipment 18 and the upstream switchboard 15 and frequency converter 13.

Because of the current capacity of the PTM, and the characteristics of current flow at turn-on, a plural level current threshold can be used during turn-on. As an example and as shown in FIG. 2, the turn-on current level for the circuit breaker is 300 amps for a duration of 10 milliseconds. This level is then reduced to 150 amps for 25 milliseconds, after which a set point level of 75 amps is maintained. Curve 21 shows the envelope of the expected current through the breaker 19 immediately after turn-on. An initial current surge of more than 200 amps decreases to less than 150 amps 10 milliseconds after turn-on and to less than the set point of 75 amps 25 milliseconds after turn-on.

Turning now to FIG. 3, an in-rush of current through the breaker 19 caused by equipment start-up or a momentary current surge on the line is shown. If the set point current level of 75 amps is exceeded, the circuit breaker enters a surge mode in which a maximum of 150 amps can exist on the line for a period of 25 milliseconds. After 25 milliseconds, the system will only tolerate the set point level of 75 amps on the line; and if the set point level is exceeded, the circuit breaker treats this condition as a fault and opens the circuit. For a period of 10 milliseconds after the 25 millisecond surge mode period of 150 ampere tolerance, the circuit breaker will not re-enter the 150 amp surge mode. However, after the 10 millisecond period has passed, the surge mode may again be entered. Curve 23 shows the envelope typical inrush current as a result of a load being added to the line.

FIGS. 4A and 4B show a circuit diagram of the solid state circuit breaker 19 of the invention. It will be understood that FIG. 4B shows circuitry related to the phase A current only and that similar circuitry is required for the phase B and phase C currents. As shown in FIG. 4A, the phase A, phase B, and phase C currents are all applied to the comparators 41, 42, and 43.

The breaker 19 includes the power transistor module (PTM) 25 which is a solid state device comprising a plurality of transistors in a Darlington configuration with a damper diode across the emitter and the collector. The PTM includes a collector terminal 26, an emitter terminal 27, and a base terminal 28. A snubber network 24 is coupled across the collector and emitter terminals 26 and 27 of the PTM to absorb energy in the PTM at turn-off. The phase A current is coupled to the collector terminal 26 of the PTM 25, and a control signal for the PTM is applied to the base terminal 28 from a an opto isolator 52 and a driver circuit 53 as more fully explained below.

The emitter terminal 27 of the PTM device is coupled to a current sensing resistor 29 which monitors the current flowing through the PTM 25 and converts the current to a voltage which is amplified and used for control purposes.

The voltage across the resistor 29 is monitored by a differential amplifier 31 which subtracts any control voltage present at the emitter terminal 27 to develop the true voltage across the current sensing resistor 29. The differential amplifier 31 also gives the voltage on the resistor 29 a slight gain. The differential amplifier 31 has an output 32 which is rectified by a precision full wave rectifier 33. The rectified output 34 of the full wave rectifier 33 is applied to a driver circuit 36 which powers a light emitting diode in an opto isolator 38. The opto isolator 38 isolates the three phases from one another to prevent a short circuit and to provide a low-level signal which is used in the remainder of the breaker circuitry. A gain stage 39 coupled to the output of the opto isolator 38 applies the signal from the opto isolator to three comparators 41, 42, and 43. The comparators 41, 42, and 43 also receive similar signals from the respective gain stages (not shown) for the phase B and phase C currents. Comparator 41 has a threshold current level of 300 amps, comparator 42 a threshold current level of 150 amps, and comparator 43 a threshold current level equal to the set point of 75 amps.

The circuit breaker 19 has three control switches 45 comprising an On switch 67, and Off switch 68, and a Fault Clear switch 69. To eliminate the contact bounce of the switches 67, 68, and 69, a de-bounce circuit is used for each. The de-bounce circuits give the circuit breaker a clean turn-on and turn-off.

Closing the On switch 67 causes the signal on the line 50 to go high. Closing the Off switch 68, or the receipt of a low signal on the line 66, as more fully explained below, causes the signal on the line 50 to go low. The signal on line 50 is coupled to one input of an AND gate 51, the output of which controls an opto isolator 52. The output of the opto isolator 52 is coupled to the driver 53 for the PTM 25. Closing the Off switch 68 causes the signal on the output line 50 to be low. The output of the AND gate 51 then goes low to turn off the opto isolator 52 and the driver circuit 53 to turn off the PTM. The Fault Clear switch 69 is a lock-out for the On switch 67 which prevents the switch 67 being activated until the Fault Clear switch 69 has been depressed.

The output of the comparator 41 is high if the voltage representation of the current applied to the comparator is less than 300 amps. If the voltage representation of the current flowing through the PTM exceeds 300 amps, the output of the comparator 41 will switch from high to low, and the low signal will be applied to the AND gate 46. This causes the output of the AND gate 46 to go low and apply the low to the second input of the AND gate 51. The output of the AND gate 51 goes low thus turning off the opto isolator 52 and causing the driver 53 to turn off the PTM 25. The output of the AND gate 46 is also coupled to the fault input 66 of the control switches 45. A low signal on to the fault input 66 causes a fault indicator 65 to be illuminated. The fault indicator 65 will remain illuminated until the Fault Clear switch 69 is depressed.

The comparator 42 has a threshold level of 150 amps and the output of the comparator 42 is high unless the 150 amp threshold is exceeded. If the output of the comparator 42 goes low, a low is applied to the OR gate 47, the output of which is coupled to one input of an AND gate 48. The output of the AND gate 48 comprises a second input to the AND gate 46. A 10 millisecond one-shot multivibrator 49 comprises a second input to the OR gate 47. The input of the one-shot multivibrator 49 is coupled to the output line 50 of the control switches 45 and is triggered when the On switch 67 is activated. The second input of the AND gate 48 is coupled to the output of an OR gate 57.

A first NAND gate 54, the resistor 58, a capacitor 59, and a second NAND gate 60 comprise a first input for the OR gate 57. The second input for the OR gate 57 is provided by the output of an OR gate 56. A 25 millisecond one-shot multivibrator 61 coupled to the output line 50 of the control switches 45 comprises a first input for the OR gate 56. A second 25 millisecond one-shot multivibrator 62 comprises a second input for the OR gate 56. The input of the one-shot 62 is coupled to the output of a 35 millisecond one-shot multivibrator 63. The multivibrator 63 provides an output in response to the falling edge of a voltage change. The input of the multivibrator 63 is coupled to the output of an AND gate 64, and the Q-not output 65 of the multivibrator 63 provides a first input to the AND gate 64. The second input for the AND gate 64 is provided by the output of the set point comparator 43.

A delay line is created by the combination of the NAND gates 54 and 60 and the RC combination of the resistor 58 coupled to a voltage V and the capacitor 59 coupled to ground. This combination of elements provides a delay in the output of the NAND gate 54 in response to an output of the NAND gate 60.

The feedback of the output of one-shot multivibrator 63 to the input of the AND gate 64 provides an inhibiting feature whereby the one-shot 63 cannot be reset during its 35 millisecond output period.

MODE OF OPERATION OF THE PREFERRED EMBODIMENT

A circuit breaker of the instant invention is turned on by the On switch 67. This causes the output of the control switches 45 on line 50 to go high. This high is applied to one of the inputs of AND gate 51. At this time, the outputs of the three comparators 41, 42, and 43 are all high since the threshold current levels of the comparators are not being exceeded. As a result, the output of the AND gate 46 is high, the output of AND gate 51 is high, and each PTM 25 is turned on by its opto isolator 52 and associated driver circuit 53 (only phase A shown).

The driver circuit 53 for the PTM 25 applies five volts to the base terminal 28 of the PTM and zero volts to the emitter terminal 27 of the PTM to turn the PTM on to its conductive state. Current then flows through the PTM to the current sensing resistor 29 generating a voltage across the resistor 29. The differential amplifier 31 detects the voltage across the resistor 29 and applies the detected waveform 32 to the precision full wave rectifier 33. The rectified waveform 34 is applied to the driver 36 for the light emitting diode in the opto isolator 38. To maximize the voltage swing of the signal from the opto isolator 38, the output of the isolator 38 is coupled to the gain stage 39. The output of gain stage 39 is applied to the three comparators 41, 42, and 43. At the same time, the output of similar gain stages for the phase B and phase C currents are applied to the three comparators 41, 42, and 43. As long as the threshold levels in each of the comparators 41, 42, and 43 is not exceeded, each comparator has an output which is high.

At the same time that AND gate 51 is driven high by output 50 of the control switches 45, the output of each of the one-shot multivibrators 49 and 61 is driven high by the pulse on the output 50. This causes the one-shot 49 to give a 10 millisecond pulse and the one-shot 61 to give a 25 millisecond pulse. The output of the one-shot 49 is applied to one input of the OR gate 47, the other input of which is connected to the output of the comparator 42. If the threshold level of 150 amps of comparator 42 is exceeded during the first 10 milliseconds after turn-on, the high signal from the one-shot 49 maintains the output of the OR gate 47 high and this output is coupled to AND gate 48. Simultaneously, the 25 millisecond output from one-shot 61 is applied to OR gate 56 which applies a high signal to OR gate 57, the output of which is coupled to the second input of AND gate 48. Thus the output of 48 is high and this output is applied to one input of AND gate 46. At the same time, provided the input to the comparator 41 does not exceed 300 amps, the output of comparator 41 remains high; and this output is applied to the other input of AND gate 46. This causes the output of AND gate 46 to be high and this output is applied to the input of AND gate 51.

After 10 milliseconds, the one-shot 49 times out, thus removing the high from one input from the OR gate 47. At this time, if the threshold of 150 amps of comparator 42 is not exceeded, the comparator 42 has a output which is high, which when coupled to OR gate 47 causes the OR gate 47 to have a high output which is applied to the input of the AND gate 48.

Twenty-five milliseconds after initial turn-on, the output of the one-shot 61 goes low. This removes the high applied to the one input of OR gate 56 and the one input of OR gate 57. Assuming at this time that the current through the PTM transistor 25 has decayed to less than set point level of 75 amps, the output of comparator 43 will be high, and this high is applied to the other input of OR gate 57 causing the output of the OR gate 57 to be high, the AND gate 48 to have a high output, the AND gate 46 to have a high output, and the AND gate 51 to have a high output, thus keeping the opto isolator 52 on. As long as the current level at turn-on does not exceed the three level current threshold shown in FIG. 2, the opto isolator 52 through the driver circuit 53 will keep the PTM 25 on.

Assume now for purposes of illustration that the current through the PTM at the end of 10 milliseconds is greater than 150 amps. This causes the output of comparator 42 to be low. After 10 milliseconds, the output of multivibrator 49 also goes low. These two lows are applied to the OR gate 47 causing the OR gate 47 to have a low output. As a result, the AND gates 48, 46, and 51 have a low output, and the opto isolator 52 through the driver circuit 53 turns the PTM 25 off.

Assume now that immediately after turn-on the 300 amp limit of comparator 41 is not exceeded during the first 10 milliseconds of operation and the 150 amp limit of comparator 42 is not exceeded during the next 15 millisecond of operation. However, the set point level of 75 amps of comparator 43 is exceeded after the first 25 milliseconds of operation. In this example, the output of comparator 43 is low, the output of NAND gate 60 is high, the output of NAND gate 54 is low, and since the output of one-shot 61 is low after 25 milliseconds, the output of OR gate 56 is low and the two inputs of OR gate 57 is low. This causes AND gates 48, 46, and 51 to go low, and the opto isolator 52 through the driver circuit 53 turns the PTM 25 off.

Consider next that the current is flowing through the PTM 25 and a transient occurs on the line causing the current to exceed the set point level of 75 amps of the comparator 43 but not the 150 amp threshold level of comparator 42. In response to this condition, the output of comparator 43 goes low. The time delay of the NAND gates 54 and 60, the resistor 58, and the capacitor 59 is a few microseconds longer than the reaction time of the NAND gate 56, the multivibrators 62 and 63, and the AND gate 64. Thus, when the output of comparator 43 goes low, the output of NAND gate 57 goes high. The NAND gate 54 then goes low, but not before the circuit elements 56, 62, 63, and 64 react to the low condition of comparator 43. When the input to 64 from comparator 43 goes low, the output of AND gate 64 goes low. This is detected by the one-shot 63 which is a falling edge device and the one-shot 63 gives a 35 millisecond pulse in response. The turn-on of one-shot 63 causes one-shot 62 to turn on for 25 milliseconds. Thus the output of 62 is high causing the output of OR gate 56 to be high, the output of OR gate 57 to be high, and one input to AND gate 48 to be high. If the threshold of 150 amps in comparator 42 is not exceeded, the output of 42 is high, thus the output of OR gate 47 is high, and the other input of AND gate 48 is high. This causes the output of 46 to be high, the output of 51 to be high, and the opto isolator 52 and the PTM 25 remain on.

The feedback of the Q-not output 65 of one-shot 63 into the input of AND gate 64 prevents the one-shot 63 from being retriggered on more than once in a 35 millisecond interval. Thus, the threshold of comparator 43 is overridden by the action of one-shot 62 only for the first 25 milliseconds of a 35 millisecond period. After the 25 millisecond period, if the threshold of comparator 43 is exceeded, the opto isolator 52 through the driver circuit 53 will turn the PTM 25 off. If the level of comparator 43 is not exceeded for 10 milliseconds after the 25 millisecond period, the opto isolator 52 remains on. The one-shot 63 is a retriggerable device. For this reason, gate 64 receives the low from the one-shot 63 to block a low signal coming from comparator 43 before the one-shot 63 has an opportunity to time out.

The driver circuit 53 biases the PTM 25 for maximum turn-off and speed. When the PTM 25 is on, it is in the saturated state. If the state is one of deep saturation, a significant charge is stored within the PTM. Changing the state of the PTM 25 from conducting to nonconducting requires that the charge stored in the PTM be removed, and removal of a significant charge slows down the operation of the circuit breaker. For this reason, the driver circuit applies 5 volts to the base terminal 28 of the PTM and 0 volts to the emitter terminal 27 to turn the PTM 25 on. This bias is not enough to put the PTM in a state of deep saturation, and only a minimum charge is stored in the PTM. In order to switch the PTM off, the driver circuit applies 5 volts to the emitter and 0-volts to the base to create a negative potential which draws the charge stored in the PTM so that it may rapidly switch from on to off.

Having thus described the invention, various alterations and modifications thereof will be apparent to those skilled in the art, which modifications and alterations are intended to be within the scope of the invention as defined in the appended claims.

What is claimed is:

1. An AC circuit breaker comprising:
   a three terminal solid state device which may be turned On and Off;
   a current path through the AC circuit breaker comprising the solid state device;
   means for sensing current through the AC circuit breaker;
   comparator means establishing a plurality of time related threshold current levels for the AC circuit breaker which are effective during successive periods of time; and
   means for turning the solid state device from On to Off in less than 10 microseconds in response to current in the AC circuit breaker which exceeds one of the threshold current levels.

2. The AC circuit breaker of claim 1 wherein the comparator means comprises:
   a first comparator (41);
   a first threshold current level established by the first comparator;
   a second comparator (42); and
   a second threshold current level established by the second comparator, wherein the second threshold current level is longer than the first threshold current level.

3. The AC circuit breaker of claim 2 further comprising:
   a first period of time; and
   first timing means (49) limiting the use of the first comparator for the first period of time, whereby the second threshold current value may be exceeded only for the duration of the first period of time.

4. The AC circuit breaker of claim 3 further comprising:
   a third comparator (43);
   a third threshold current value established by the third comparator which is lower than the second threshold current value;
   a second period of time; and
   second timing means (61) limiting the use of the second comparator for the second period of time, whereby the third threshold current value may be exceeded only for the duration of the second period of time.

5. The AC circuit breaker of claim 4 further comprising:
   an On switch (67) for the circuit breaker, the On switch comprising a means for starting the first timing means, whereby the second threshold current value may only be exceeded immediately after activation of the On switch and for the duration of the first period of time.

6. The AC circuit breaker of claim 5 further comprising:
   means for starting the second timing means comprising said On switch, whereby the third threshold current value may be exceeded by a current which is less than the second threshold current value for a second period of time immediately after activation of the On switch.

7. The AC circuit breaker of claim 6 further comprising:
   a third period of time;
   a third timing means (62) limiting the use of the second comparator for the third period of time, whereby the third threshold current value may be exceeded during the third period of time.

8. The AC circuit breaker of claim 7 further comprising:
   means (63) for starting the third timing means;
   means (65) for inhibiting the starting means, said inhibiting means having an operating period which is longer than the third period of time and said inhibiting means being activated by said starting means, whereby the inhibiting means prevents the re-starting of the third timing means during the third period of time.

9. A fast acting AC circuit breaker comprising:
a power transistor module (PTM) comprising emitter, base, and collector terminals;
a current path through the circuit breaker comprising the emitter and collector terminals of the PTM;
current sensing means in the current path for sensing current through the PTM;
a comparator means having a plurality of time related threshold current levels comparing the current through the PTM with the plural level current threshold; and
a driver circuit coupled to the comparator means and to the base terminal of the PTM, whereby the driver circuit turns the PTM Off in response to current through the circuit breaker which exceeds the plural level current threshold.

10. The fast acting AC circuit breaker of claim 9 further comprising:
a first comparator (41) defining a maximum current level;
a second comparator (42) defining an intermediate current level; and
a third comparator (43) defining a set point current level, whereby said first, second, and third comparators comprise the comparator means.

11. The fast acting AC circuit breaker of claim 10 further comprising:
an On switch (67) for the circuit breaker;
first timing means (49) allowing current through the circuit breaker to exceed the intermediate current level for a first period of time; and
means for starting the first timing means in response to activating the On switch for the circuit breaker.

12. The fast acting AC circuit breaker of claim 10 further comprising:
second timing means (61) allowing the current through the circuit breaker to exceed the set point current level for a second period of time; and
means for starting the second timing means in response to activating the On switch for the circuit breaker.

13. The fast acting AC circuit breaker of claim 12 further comprising:
third timing means (62) allowing current through the circuit breaker to exceed the set point current level for a third period of time; and
means for starting (63) the third timing means in response to current through the circuit breaker exceeding the set point current level.

14. The fast acting AC circuit breaker of claim 13 further comprising:
means for inhibiting (65) the means for starting in response to starting the third timing means, said means for inhibiting being active for a forth period of time which is longer than the third period of time, whereby the means for starting is inhibited from restarting the third timing means until the end of the forth period of time.

15. The fast acting AC circuit breaker of claim 14 wherein the inhibiting means blocks the means for starting for a preselected period of time, whereby the means for starting re-starts the third timing means after said preselected period if current through the circuit breaker again exceeds the set point current level.

* * * * *